United States Patent
Sjöland et al.

(10) Patent No.: US 11,265,003 B2
(45) Date of Patent: Mar. 1, 2022

(54) CONTROL OF A TIME-INTERLEAVED ANALOG-TO-DIGITAL CONVERTER

(71) Applicant: Telefonaktiebolaget LM Ericsson (publ), Stockholm (SE)

(72) Inventors: Henrik Sjöland, Lund (SE); Fredrik Tillman, Lund (SE); Henrik Fredriksson, Lund (SE); Lars Sundström, Södra Sandby (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 0 days.

(21) Appl. No.: 17/254,276

(22) PCT Filed: Aug. 31, 2018

(86) PCT No.: PCT/EP2018/073458
§ 371 (c)(1),
(2) Date: Dec. 19, 2020

(87) PCT Pub. No.: WO2020/043305
PCT Pub. Date: Mar. 5, 2020

(65) Prior Publication Data
US 2021/0273645 A1 Sep. 2, 2021

(51) Int. Cl.
*H03M 1/00* (2006.01)
*H03M 1/06* (2006.01)

(52) U.S. Cl.
CPC ....... *H03M 1/0673* (2013.01); *H03M 1/0678* (2013.01)

(58) Field of Classification Search
CPC .... H03M 1/1215; H03M 1/0673; H03M 1/46; H03M 1/462; H03M 1/1009;
(Continued)

(56) References Cited

U.S. PATENT DOCUMENTS

| 6,771,203 B1 | 8/2004 | Nairn |
| 8,890,729 B2 | 11/2014 | Lewis et al. |

(Continued)

FOREIGN PATENT DOCUMENTS

| WO | 0079684 A1 | 12/2000 |
| WO | 2008149255 A2 | 12/2008 |
| WO | 2018006972 A1 | 1/2018 |

OTHER PUBLICATIONS

PCT International Search Report, dated May 3, 2019, in connection with International Application No. PCT/EP2018/073458, all pages.

(Continued)

*Primary Examiner* — Linh V Nguyen (74) *Attorney, Agent, or Firm* — Leffler Intellectual Property Law, PLLC (57) ABSTRACT

The disclosure concerns controlling circuitry operably connectable to a plurality of constituent analog-to-digital converters (sub-ADCs) of an asynchronous time-interleaved analog-to-digital converter (TI-ADC). The controlling circuitry is configured to maintain a set of a number of sub-ADCs currently available for processing of an input sample, wherein the set is a subset of the plurality. Maintenance of the set is achieved by reception, from each of one or more of the sub-ADCs of the plurality, of an availability signal indicative of availability of the corresponding sub-ADC, and (responsive to the reception of the availability signal) addition of the corresponding sub-ADC to the set. Maintenance of the set is further achieved by (for each new input sample) selection of a sub-ADC of the set for processing of the new input sample, and (responsive to the selection) removal of the selected sub-ADC from the set and causing of the selected sub-ADC to process the new input sample. Corresponding TI-ADC, wireless communication (Continued)

receiver, wireless communication node, method and computer program product are also disclosed.

21 Claims, 5 Drawing Sheets

(58) Field of Classification Search
CPC .... H03M 1/1019; H03M 1/1028; H03M 1/12; H03M 1/121; H03M 1/1245; H03M 1/128; H03M 1/38; H03M 1/468; H03M 3/382; H03M 3/498; H03M 1/002; H03M 1/0624; H03M 1/0634; H03M 1/066; H03M 1/1061; H03M 1/124; H03M 1/125; H03M 1/1265; H03M 1/164; H03M 1/168; H03M 1/662
USPC ........ 341/118, 120, 140, 141, 142, 159, 161
See application file for complete search history.

(56) References Cited

U.S. PATENT DOCUMENTS

| | | | |
|---|---|---|---|
| 8,890,739 B2 | 11/2014 | Lewis et al. | |
| 9,112,521 B2 * | 8/2015 | Dedic | H03M 1/002 |
| 9,143,147 B1 * | 9/2015 | Ray | H03M 1/121 |
| 9,294,112 B1 * | 3/2016 | Devarajan | H03M 1/0836 |
| 9,485,039 B1 * | 11/2016 | Malkin | H04B 17/14 |
| 9,525,428 B2 | 12/2016 | Devarajan et al. | |
| 9,602,123 B2 * | 3/2017 | Sundblad | H03M 1/46 |
| 9,654,133 B2 | 5/2017 | Speir et al. | |
| 9,793,910 B1 | 10/2017 | Devarajan | |
| 2001/0052864 A1 | 12/2001 | Shimizu et al. | |
| 2014/0232575 A1 * | 8/2014 | Le Dortz | H03M 1/0624 341/118 |
| 2015/0326240 A1 * | 11/2015 | Tousi | H03M 1/1038 341/118 |
| 2015/0381195 A1 * | 12/2015 | Sundblad | H03M 1/126 341/123 |
| 2016/0049949 A1 * | 2/2016 | Waltari | H03M 1/1023 341/120 |
| 2016/0079994 A1 * | 3/2016 | Lee | H03M 1/181 341/118 |

OTHER PUBLICATIONS

PCT Written Opinion, dated May 3, 2019, in connection with International Application No. PCT/EP2018/073458, all pages.

* cited by examiner

CONTROL OF A TIME-INTERLEAVED ANALOG-TO-DIGITAL CONVERTER

TECHNICAL FIELD

The present disclosure relates generally to the field of analog-to-digital converters. More particularly, it relates to control of a time-interleaved analog-to-digital converter.

BACKGROUND

There is a strong trend in wireless communication to use ever-increasing bandwidth. This trend poses more and more stringent requirements on wireless transceivers, including analog-to-digital converters (ADCs) comprised therein.

Time interleaving is a powerful ADC technique for achieving high bandwidth operation with attractive power consumption. In a time-interleaved analog-to-digital converter (TI-ADC), a plurality of lower speed sub-ADCs (which may also be referred to as constituent ADCs) are used in parallel in a time interleaved fashion. Thus, when M sub-ADCs are used for processing respective samples, each sub-ADC only needs to process every $M^{th}$ sample and the speed requirement of each sub-ADC is then relaxed by a factor M compared to a non-TI-ADC.

A drawback of the TI-ADC technique is that—unless the sub-ADCs are exactly identical—output imperfections will occur due to mismatch between the sub-ADCs as exemplified in the following. If the sub-ADCs have different direct current (DC) offsets, a fixed pattern of spurious tones equidistant in frequency will result. If the sub-ADCs have different gain and/or if there are sampling time errors, a signal dependent distortion will occur.

Calibration techniques exist that can, at least to some extent, correct for this type of errors. It is typically desirable that the calibration is fast and reliable, that it entails low cost and power overhead, and that it can be performed in the background of ADC operation without introducing disturbances. There is a need for improvements in many of these aspects.

An approach to mitigation of sub-ADC mismatch effects (that can be used as an alternative to, or in combination with, calibration techniques) is application of N redundant sub-ADCs (i.e., there being M+N sub-ADCs in total). Then, for each sample ready for conversion there are two or more (N+1) sub-ADCs available for the conversion—one of which is selected and used. This is in contrast to the conventional TI-ADC with M sub-ADCs, where, for each sample ready for conversion, there is only one sub-ADC available for the conversion. By making the selection among the available N+1 sub-ADCs random (or pseudo-random), the imperfections (e.g., spurious tones) will not appear according to a deterministic pattern (e.g., in time and/or frequency), but will rather be experienced as—possibly white—noise. The presence of noise may be more favorable than patterned imperfections in many applications, and for wireless communication (e.g., cellular) applications in particular.

An example of a time-interleaved ADC where randomization of the time-interleaved converters is applied can be found in U.S. Pat. No. 9,793,910 B1.

There is a need for improved approaches for time-interleaved analog-to-digital converters. Such approaches may, for example, aim at mitigating imperfections due to mismatch and/or solving problems related to resource management and usage.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Generally, when an arrangement is referred to herein, it is to be understood as a physical product; e.g., an apparatus. The physical product may comprise one or more parts, such as controlling circuitry in the form of one or more controllers, one or more processors, or the like.

It is an object of some embodiments to provide improved approaches for time-interleaved analog-to-digital converters. The inventors have developed a relatively efficient manner of managing sub-ADCs in a TI-ADC.

According to a first aspect, controlling circuitry is provided. The controlling circuitry is operably connectable to a plurality of constituent analog-to-digital converters (sub-ADCs) of an asynchronous time-interleaved analog-to-digital converter (TI-ADC). The controlling circuitry is configured to maintain a set (also referred to herein as a "pool") of a number of sub-ADCs currently available for processing of an input sample, wherein the set is a subset of the plurality.

The controlling circuitry is configured to maintain the set by reception (from each of one or more of the sub-ADCs of the plurality) of an availability signal indicative of availability of the corresponding sub-ADC, and (responsive to the reception of the availability signal) addition of the corresponding sub-ADC to the set.

The controlling circuitry is further configured to maintain the set by (for each new input sample) selection of a sub-ADC of the set for processing of the new input sample, and (responsive to the selection) removal of the selected sub-ADC from the set and causing of the selected sub-ADC to process the new input sample.

In some embodiments, the selection comprises randomized selection.

In some embodiments, the controlling circuitry is further configured to monitor one or more statistical properties of the number of sub-ADCs in the set.

In some embodiments, the controlling circuitry is further configured to determine whether the number of sub-ADCs in the set fulfills a set size criterion, and (responsive to determination that the number does not fulfill the set size criterion) provide parameter control signaling configured to adapt one or more operational parameter of the plurality of sub-ADCs.

In some embodiments, the set size criterion comprises one or more of: a minimum number of sub-ADCs in the set being larger than a minimum number threshold, and an average number of sub-ADCs in the set being larger than an average number threshold.

In some embodiments, the operational parameter is one or more of: a supply voltage, a bias current, and a sampling frequency.

In some embodiments, the controlling circuitry is further configured to force termination of processing of a particular input sample by a particular sub-ADC when a duration of the processing has reached a maximum processing duration.

A second aspect is a time-interleaved analog-to-digital converter (TI-ADC) comprising the controlling circuitry according to the first aspect and a plurality of sub-ADCs, wherein each sub-ADC is configured to process an input sample responsive to selection by the controlling circuitry and provide an availability signal indicative of availability to the controlling circuitry in association with completing the processing.

In some embodiments, the TI-ADC further comprises an output buffer operatively connected to each of the sub-ADCs of the plurality for reception of an output sample of the sub-ADC, and operatively connected to the controlling circuitry for reception of buffer control signaling indicative of a position of the output buffer, the output buffer configured to insert the received output sample into the position of the output buffer.

In some embodiments, the output buffer is configured to simultaneously receive output samples from a collection of the sub-ADCs, the collection having a varying cardinality in an interval from zero to a maximum cardinality, wherein the maximum cardinality is larger than one.

A third aspect is a wireless communication receiver comprising the TI-ADC of the second aspect.

A fourth aspect is a wireless communication node comprising the TI-ADC of the second aspect or the wireless communication receiver of the third aspect.

A fifth aspect is a method of controlling a plurality of constituent analog-to-digital converters (sub-ADCs) of an asynchronous time-interleaved analog-to-digital converter (TI-ADC). The method comprises maintaining a set of a number of sub-ADCs currently available for processing of an input sample, wherein the set is a subset of the plurality.

Maintaining the set is achieved by receiving (from each of one or more of the sub-ADCs of the plurality) an availability signal indicative of availability of the corresponding sub-ADC, and (responsive to the reception of the availability signal) adding the corresponding sub-ADC to the set.

Maintaining the set is further achieved by (for each new input sample) selecting a sub-ADC of the set for processing of the new input sample, and (responsive to the selection) removing the selected sub-ADC from the set and causing the selected sub-ADC to process the new input sample.

A sixth aspect is a computer program product comprising a non-transitory computer readable medium, having thereon a computer program comprising program instructions. The computer program is loadable into a data processing unit and configured to cause execution of the method according to the fifth aspect when the computer program is run by the data processing unit.

In some embodiments, any of the above aspects may additionally have features identical with or corresponding to any of the various features as explained above for any of the other aspects.

An advantage of some embodiments is that approaches are provided for mitigating imperfections due to mismatch in time-interleaved analog-to-digital converters.

Another advantage of some embodiments is that the imperfection mitigation is improved compared to at least some approaches of the prior art.

Yet another advantage of some embodiments is that, by application of some embodiments, sub-ADCs with different—signal dependent—conversion can be used to their full potential in time-interleaved analog-to-digital converters.

A further advantage of some embodiments is that ADC performance can be maintained while keeping power consumption at a low level. No trade-off between performance and power consumption is needed; or less trade-off compared to at least some approaches of the prior art.

Yet a further advantage of some embodiments is that control of the selection parameters may be achieved (e.g., such that metric values of the randomization result can be guaranteed).

BRIEF DESCRIPTION OF THE DRAWINGS

Further objects, features and advantages will appear from the following detailed description of embodiments, with reference being made to the accompanying drawings. The drawings are not necessarily to scale, emphasis instead being placed upon illustrating the example embodiments.

DETAILED DESCRIPTION

As already mentioned above, it should be emphasized that the term "comprises/comprising" when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Embodiments of the present disclosure will be described and exemplified more fully hereinafter with reference to the accompanying drawings. The solutions disclosed herein can, however, be realized in many different forms and should not be construed as being limited to the embodiments set forth herein.

One problem with the approach of U.S. Pat. No. 9,793,910 B1 is that the processing capacity allocated for each sub-ADC to process a sample (via the enforced phase adjustment) may lead to sub-optimal operation of one or more of the sub-ADCs in that the allocated processing capacity may be too high so that the sub-ADC is not fully utilized or too low so that the sub-ADC is not able to deliver an accurate digitized sample. Thus, a complication with this approach (and other TI-ADC approaches) is that the speed of conversion of a sample may be different in different sub-ADCs. Such differences may be due to, e.g., variations between the sub-ADCs themselves and/or that different input signal levels may need different amounts of processing for conversion.

In the following improved approaches for time-interleaved analog-to-digital converters will be described and exemplified.

In approaches using synchronous (clocked) sub-ADCs, as in U.S. Pat. No. 9,793,910 B1, the clock frequency must be set with a margin to keep the probability of errors at an acceptably low level. Thus, the clock frequency is—for at least some sample conversions—lower than it needs to be, thereby preventing efficient use of the inherent processing capacity of the sub-ADCs.

The ADC operation for each input sample to convert may involve taking D decisions in sequence, each decision may determine if a voltage is within a given range or not. In a synchronous ADC each decision cycle may be triggered by an external clock such that at least D clock periods are required to complete the conversion. Thus, the clock frequency will be at least D times higher than the rate of which samples can be provided to the ADC.

In an asynchronous ADC each decision typically also involves generating a ready signal to indicate when the decision has been made. The ready signal is used to trigger the next decision cycle and so on. Hence, an asynchronous ADC may be seen as a self-timed ADC where the decisions events are not synchronous with any externally provided clock. Thus, the clock provided to the asynchronous ADC only needs to have a frequency equal to the sample rate to trigger the first decision cycle. In an asynchronous ADC the time used by each decision can be allowed to vary substantially as long as all decisions have been made before a new input sample is provided to the ADC.

Thus, asynchronous ADC designs are not bound by any clock frequency in the same manner as synchronous ADCs. For asynchronous sub-ADCs, the conversion time (related to the processing capacity) may, for example, vary with the input signal. In a typical example, certain input signals trigger a very small input signal to a comparator in the sub-ADC, which in turn results in a long conversion time (associated with a smaller processing capacity) for that particular sub-ADC for that particular conversion. Hence, it is typically not possible to predict the time needed for each conversion.

Therefore, using asynchronous sub-ADCs in a TI-ADC, time margins typically still need to be considered. This is due to that the sub-ADCs would typically have substantially different conversion times for different samples, for different input signal properties, for different sub-ADCs, and/or depending on other parameters such as temperature and the like. Thereby, there is a risk that a sub-ADC is not ready when it is needed for processing of a new sample. Thus, there is still a problem that efficient use of the inherent processing capacity of the sub-ADCs cannot be achieved.

Embodiments disclosed herein provides an asynchronous TI-ADC, applying asynchronous sub-ADCs (e.g., based on successive approximation register—SAR—techniques or on pipeline ADC techniques). In some embodiments, the asynchronous sub-ADCs are synchronous with regards to the start of each conversion of a sample (e.g., in relation to, or alignment with, a sampling clock), while the internal operations within the sub-ADCs (and thereby the completion of each conversion) are asynchronous.

To be able to efficiently use the processing capacity, the asynchronous sub-ADCs are configured to indicate when they are available for processing of a new sample, and a control function manages the use of the asynchronous sub-ADCs for processing of samples.

Figure 1:
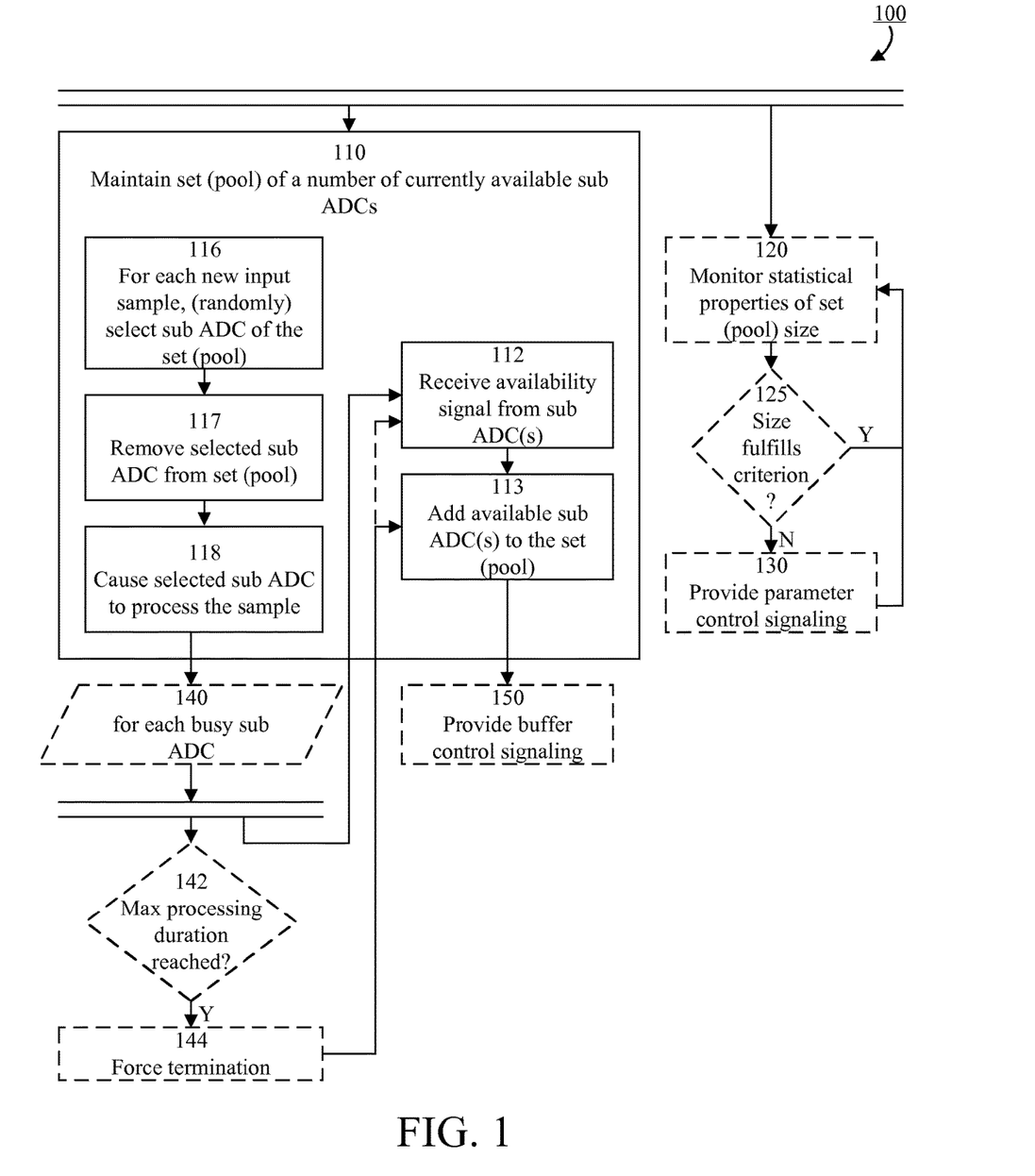
FIG. 1 is a flowchart illustrating example method steps according to some embodiments.

FIG. 1 illustrates an example method 100 for the control function, according to some embodiments. The method may be performed by controlling circuitry for a TI-ADC.

Furthermore, the controlling circuitry and/or the TI-ADC may be suitable for being comprised in one or more of a wireless receiver (e.g., a wireless transceiver) and a wireless communication node (e.g., a network node or a wireless communication device).

Thus, the method 100 is a method of controlling a plurality of sub-ADCs of an asynchronous TI-ADC.

As illustrated by step 110, the method comprises maintaining a set (also referred to herein as a "pool") of a number of sub-ADCs currently available for processing of an input sample, wherein the set is a subset of the plurality. Maintenance of the pool is achieved by sub-steps 112-118 as illustrated in FIG. 1, and as will be described more thoroughly in the following.

For each new input sample, a sub-ADC of the maintained set (the pool) is selected for processing of the new input sample as illustrated by sub-step 116. Selecting may, for example, comprise randomly (or pseudo-randomly) selecting a sub-ADC of the set. The random selection may be uniform or may be in accordance with any other suitable probability distribution. In some embodiments, the selection (whether random, pseudo-random, or deterministic) may be based on information (e.g., statistics) regarding previous selections of the sub-ADCs. Thus, the selection may be in accordance with a suitable statistical process. For example, the selection may be biased such that a sub-ADC that has not been used for a long time has an increased probability of selection. Alternatively or additionally, the selection may be biased such that a sub-ADC that has been selected at a plurality of points in time which form a pattern in the time domain (e.g., are substantially equidistant) may have a decreased probability of selection at future points in time that complete the pattern. Generally, a typical aim of the selection implementation is to make deviations that occur due to, e.g., implementation and/or processing imperfections appear as noise.

Responsive to the selection, the selected sub-ADC is removed from the maintained set (the pool) as illustrated by sub-step 117 and the selected sub-ADC is caused to process the new input sample as illustrated by sub-step 118. The causing of sub-step 118 may be performed by any suitable known or future approach, e.g., involving control signaling to the selected sub-ADC.

As mentioned above, the sub-ADCs are configured to indicate when they are available for processing of a new sample, e.g., by providing an availability signal indicative of availability of the corresponding sub-ADC. Thus, for each busy sub-ADC (see step 140), an availability signal may be provided as soon as the sub-ADC is no longer busy and thereby available for processing of a new sample.

In some embodiments, the availability signal is provided when the sub-ADC is predicted to "soon" have terminated the processing of the current sample. Examples include that the sub-ADC has completed some particular task of the sample processing and/or has only a certain number (e.g., one, two, three, or more) of least significant bits left to determine. Examples of the particular task includes that a certain number of (typically; most significant) bits have been determined, or that a certain number of decision cycles have been completed (which is typically more general since each decision cycle may determine one or more bits). This approach enables relaxing of the speed required in the controlling circuitry and/or allows for a higher clock frequency.

In some embodiments, the availability signal is provided when the sub-ADC has terminated the processing of the current sample (before or after, in various embodiments, the digitized sample has been provided as an output of the sub-ADC).

Generally, a busy sub-ADC may be defined as an ADC that has been caused to process a particular sample (see sub-step 118) and has not yet provided an availability signal associated with termination of the processing of that particular sample.

In sub-step 112, a provided availability signal is received from each of one or more of the sub-ADCs of the plurality. Since the completion of conversion of the sub-ADCs of the plurality is asynchronous, the reception of sub-step 112 may comprise receiving an availability signal from a single sub-ADC at some time instants and simultaneously (or substantially simultaneously) receiving respective availability signals from several sub-ADCs at other time instants. There may also be time instants where no availability signal from any sub-ADC is received.

The sub-ADC(s) corresponding to the received availability signal(s) are then—responsive to the reception of the availability signal—added to the maintained set (the pool) as illustrated by sub-step 113.

A typical asynchronous ADC continues processing of the same sample until a digitized sample result which fulfils some required criteria (e.g. in terms of one or more of: resolution, accuracy, number of decision cycles, number of bits, etc.) can be provided at the ADC output. Therefore, it may happen that processing of some samples takes a very long time (depending, e.g., on required criteria, signal properties, etc.). If this happens simultaneously for several of the sub-ADCs of a TI-ADC approach as described above, it may lead to that the set of available sub-ADCs shrinks substantially which makes the randomization (noising) of the selection process less efficient. In extreme cases, there may even be no available sub-ADCs (empty set/pool) when a selection is to be done.

However, provided that the average and/or minimum pool size is controlled to a reasonable level as will be explained later herein, the main problem with long processing times is that the output buffer length is limited and thereby entails a maximum sample processing time that can be handled. Of course, the output buffer length may be extended to be able to handle longer processing times at the cost of, e.g., complexity but it will always have a limited length.

There may also be other limitations of the approach that entails a maximum sample processing time that can be handled without entering an out-of-bound state. For example, there may be a maximum delay that can be accepted due to other reasons than the output buffer length. Such maximum delay may be application specific (e.g., for real-time applications and applications with a maximum acceptable latency) and/or may be implementation specific (e.g., due to constrains of hardware and/or software before and/or after the TI-ADC in the processing flow).

To avoid one or more of these problems, some embodiments implement an approach to avoid that a sub-ADC is tied up in the processing of a single sample during too long time. Such an approach is illustrated by optional steps 142 and 144 in FIG. 1.

Thus, for each busy sub-ADC (see step 140), the method may comprise determining when a duration of the processing of the current sample has reached a maximum processing duration, as illustrated by step 142. The value of the maximum processing duration may be set statically or dynamically.

The determination may, for example, be implemented by keeping a timer for each busy sub-ADC, wherein the timer is started in association with any of the sub-steps 116-118. The timer may be kept by the controlling circuitry and associated with the respective sub-ADC, or each sub-ADC may measure its own processing duration.

The timer may be an incremental timer started at zero wherein it is determined that duration of the processing of the current sample has reached the maximum processing duration when the timer has reached a value corresponding to the maximum processing duration.

Alternatively, the timer may be a decremental timer started at a value corresponding to the maximum processing duration wherein it is determined that duration of the processing of the current sample has reached the maximum processing duration when the timer has expired (e.g., reached a zero value). Other suitable timer solutions, as well as other suitable determination approaches, may also be applicable.

When it is determined that duration of the processing of the current sample has reached the maximum processing duration (Y-path out of step 142), the processing of that particular input sample by that particular sub-ADC may be forced to terminate as illustrated by step 144. Then, the sub-ADC is added to the maintained set (the pool) as illustrated by sub-step 113 (with—as illustrated by step 112—or without provision of a corresponding availability signal in association with the forced termination).

When a sub-ADC is forced to terminate the processing of a particular sample, that sample has typically only been partly digitized; e.g., most significant bits having been determined while one or more least significant bits remain to determine. One possibility to address this problem is to output the already determined most significant bits and output some assumed (estimated) value for the not yet determined bits. Examples of suitable assumed values include: the values already present in an output register of the sub-ADC (presumably associated with a previously digitized sample), any of the values [011 . . . 11] or [100 . . . 00] (since this brings the digitized sample as close to the already determined most significant bits as possible), and any of the values [00 . . . 00] or [11 . . . 11] (for simplicity). The examples [011 . . . 11], [100 . . . 00], [00 . . . 00] and [11 . . . 11] are relevant to binary-weighted ADCs, wherein the outputted bits actually represent their value by their position. In a more general case, each bit may instead be associated with a unique weight and then the replacement value may become different.

When a SAR sub-ADC is forced to termination, the most significant bits have most likely been decided, which reduces the error that will occur when estimating the remaining bits. If the presently active comparator of a SAR is metastable it is close to its decision threshold, and the actual value will be close to the current value. Even if there is no metastability, a mid-interval guess will be appropriate to try to minimize the expected error. Alternatively, and for other types of sub-ADCs where intermediate results may not be as readily available, an interpolation between adjacent samples can be performed to find the value of the missing sample.

Since the TI-ADC is asynchronous, the number of sub-ADCs in the set (the set size) will vary over time. In some embodiments, the method may further comprise monitoring one or more statistical properties of the number of sub-ADCs in the set as illustrated by optional step 120. For example, one or more of an average set size, a minimum set size, and a maximum set size may be monitored. The monitoring may be limited to a time window (e.g., monitoring of the minimum/maximum set size during a most recent period of time having a certain length). Alternatively or additionally, the monitoring may apply filtering (e.g., letting the average set size be represented by a filtered version of the momentary set size).

In optional step 125, it is determined whether the number of sub-ADCs in the set fulfills a set size criterion (which may comprise a single criterion or a combination of criteria to be fulfilled). Typically, the set size criterion (or criteria) aim at keeping the set size at a value that ensures efficient randomization (noising) of the of the selection process; to make deviations that occur due to, e.g., implementation and/or processing imperfections appear as noise. Typically, this aim is better fulfilled the larger the set size is; in relation to the total number of sub-ADCs. On the other hand, each available sub-ADC represents unused processing capacity.

The set size criterion may, for example, be that the minimum set size is larger than a minimum number threshold, and/or that the maximum set size is smaller than a maximum number threshold, and/or that the average set size is larger than an average number threshold (or that the average set size is in an interval between a lower average number threshold and an upper average number threshold). The thresholds may be static or dynamic. For example, the minimum number threshold may be set to zero.

Whether to emphasize average pool size or minimum pool size, in some example scenarios, may depend on which concern is most important; sufficient randomization or that the pool is not empty. A proper combination is likely preferable.

The set size criterion and/or parameters related thereto, such as threshold values, may be static (e.g., hardcoded in the controlling circuitry), semi-static (e.g., input to the controlling circuitry at some initial point in time based on some conditions, such as at installation of a wireless communication node), or dynamic (e.g., input to the controlling circuitry at repeated points in time, such as when some conditions change). Conditions that may be relevant for set size criterion and/or parameters include which type of base station the TI-ADC is comprised in (if applicable), how many and/or which frequency bands the TI-ADC presently handles (or is to be able to handle), how many carriers the TI-ADC presently handles (or is to be able to handle) in a frequency band, the current radio channel conditions. Which type of base station the TI-ADC is comprised in may be relevant, e.g., since macro, micro, and pico base stations typically have different radio requirements, which will in turn affect the degree of required spectral shaping or smearing of interleaving errors. How many and/or which frequency bands and/or carriers the TI-ADC presently handles may be relevant, e.g., since a base station may have been designed or configured to support a certain set of frequency bands and/or carriers, but it may at any particular moment in time operate only on a subset of those in which case the conditions relevant for set size criterion and/or parameters changes.

When it is determined that the number of sub-ADCs in the set fulfills the set size criterion (Y-path out from step 125), no actions are typically taken and the monitoring of step 120 continues).

When it is determined that the number of sub-ADCs in the set does not fulfill the set size criterion (N-path out from step 125), parameter control signaling is provided as illustrated by optional step 130. The parameter control signaling is configured to adapt one or more operational parameter of the plurality of sub-ADCs, and may, for example, be provided to some or each of the sub-ADCs and/or may be provided to other mechanisms of the controlling circuitry, as suitable. Alternatively or additionally, the parameter control signaling may be provided to another unit, such as a voltage source, a current source, or a clock circuit. Typically, the adaptation of the operational parameter(s) is performed such that the set size criterion is fulfilled and/or to increase the (e.g., minimum and/or average) set size.

The operational parameter may be one or more of a supply voltage (e.g., for trading power consumption for speed), a bias current (e.g., for trading power consumption for speed), and a sampling frequency; and the corresponding parameter control signaling may affect one, several, or all sub-ADCs of the TI-ADC. For example, if the set size is not large enough to fulfill the set size criterion, the (average and/or maximum) conversion time is too long. Then, a suitable counteraction is to shorten the conversion time by increasing the conversion speed. Typically, this may be achieved by, e.g., increasing the supply voltage and/or the bias current and/or the sampling frequency. A particular example is that if less sampling rate is required, power can be saved by slowing down the sub-ADCs, such that they will still be fast enough for the pool to have an appropriate size.

Alternatively or additionally, the operational parameter may be the maximum processing duration, dynamically set as described earlier. For example, if the set size is not large enough to fulfill the set size criterion, the maximum processing duration may be decreased to force termination earlier than before.

Although not illustrated in FIG. 1, some embodiments also comprise similar mechanisms to adapt the operational parameter(s) when another set size criterion is fulfilled, to decrease the (e.g., minimum and/or average) set size. The another set size criterion may, for example, correspond to the set size criterion described above supplemented with a hysteresis to avoid premature decreasing of the set size.

In typical embodiments, the TI-ADC comprises an output buffer operatively connected to each of the sub-ADCs of the plurality for reception of an output sample of the sub-ADC. Since the completion of conversion of the sub-ADCs of the plurality is asynchronous, several of them may terminate the processing of their respective sample simultaneously or substantially simultaneously), e.g., during a same read cycle of the output buffer. Therefore, the output buffer may be able to read one or more (or none) digitized sample in a single read cycle.

Alternatively, the output buffer may be supplemented by intermediate buffering between each sub-ADC and the output buffer to enable the output buffer to read one digitized sample at a time.

Buffer control signaling may be provided to the output buffer as illustrated in optional step 150 to manage the output buffer operation. Typically, such management includes instructing the output buffer regarding which sub-ADC(s) have a digitized sample ready for reading and/or instructing the output buffer regarding into which position of the output buffer a particular digitized sample should be inserted. Thus, the buffer control signaling may be indicative, for each output sample of a sub-ADC, of a position of the output buffer, thereby causing insertion of the output sample into the position of the output buffer. When the output buffer is to read two or more digitized samples in a single read cycle (indicted, e.g., in that several availability signals are received in sub-step 112), the buffer control signaling may be indicative of a position of the output buffer for each of the corresponding digitized samples.

In various embodiments the control signaling of step 130 and/or step 150 is adequately timed (e.g., via synchronization, clocking, triggering, or similar) to cause the actions performed as a result of the control signaling (e.g., adaptation of operational parameter(s) at the sub-ADCs and/or read/write operations at the output buffer) to be carried out at appropriate moments in time.

Figure 2:
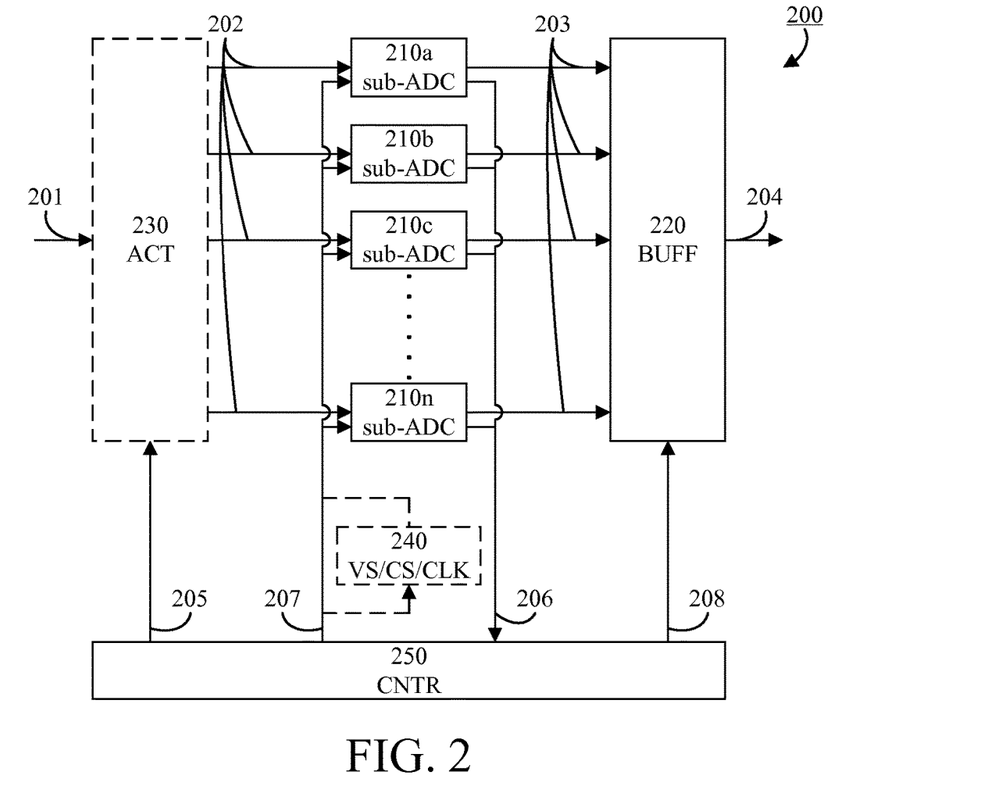
FIG. 2 is a schematic block diagram illustrating an example time-interleaved analog-to-digital converter according to some embodiments.

Further details and variations of the example method 100 will be apparent from the following description of FIG. 2, which schematically illustrates an example asynchronous TI-ADC 200 according to some embodiments. The TI-ADC 200 may be suitable for being comprised in one or more of a wireless receiver (e.g., a wireless transceiver) and a wireless communication node (e.g., a network node or a wireless communication device).

The TI-ADC 200 comprises controlling circuitry (CNTR; e.g., a controller) 250, a plurality of sub-ADCs 210*a*, 210*b*, 210*c*, . . . , 210*n* (the index n is used as a generic end index and does not mean that there are necessarily 14 sub-ADCs) and an output buffer (BUFF) 220. The TI-ADC 200 may, in some embodiments, also comprise one or more of activation circuitry (ACT; e.g., an activator) 230, a voltage source (VS; e.g. a voltage generator or other voltage supply circuitry) 240, a current source (CS; e.g. a current generator or other current supply circuitry) 240, and a clock circuit (CLK) 240. The controlling circuitry 250 (generally also referred to as a resource manager) may be configured to perform one or more of the method steps as described above in connection to FIG. 1.

The controlling circuitry 250 is operably connectable to each sub-ADC 210*a*, 210*b*, 210*c*, . . . , 210*n* of the plurality and is configured to maintain a set (a pool) of a number of sub-ADCs currently available for processing of an input sample, wherein the set is a subset of the plurality (compare with step 110 of FIG. 1).

Each of the sub-ADCs is configured to indicate when it is available for processing of a new sample, e.g., by providing an availability signal 206 to the controlling circuitry, wherein the availability signal is indicative of availability of the corresponding sub-ADC as described and exemplified in connection with FIG. 1.

Maintenance of the pool is achieved by reception (compare with step 112 of FIG. 1)—from each of one or more of the sub-ADCs of the plurality—of an availability signal 206 indicative of availability of the corresponding sub-ADC and by addition (compare with step 113 of FIG. 1)—responsive to the reception of the availability signal—of the corresponding sub-ADC to the set.

Maintenance of the pool is further achieved by selection (compare with step 116 of FIG. 1)—for each new input sample—of a sub-ADC of the set for processing of the new input sample and—responsive to the selection—removal (compare with step 117 of FIG. 1) of the selected sub-ADC from the set and causing (compare with step 118 of FIG. 1) of the selected sub-ADC to process the new input sample. The causing of the selected sub-ADC to process the new input sample may be performed by any suitable known or future approach, e.g., involving control signaling 207 to the selected sub-ADC and/or control signaling 205 to activation circuitry 230 which is configured to forward the new input sample received at input 201 to an input 202 of the selected sub-ADC. Thus, each sub-ADC is configured to process an input sample responsive to the selection by the controlling circuitry.

The controlling circuitry may be further configured to force termination of processing of a particular input sample by a particular sub-ADC (e.g., by providing a control signal 207 to the particular sub-ADC) when a duration of the processing has reached a maximum processing duration as described in connection with steps 142 and 144 of FIG. 1.

The controlling circuitry may be further configured to monitor one or more statistical properties of the number of sub-ADCs in the set (compare with step 120 of FIG. 1), determine whether the number of sub-ADCs in the set fulfills a set size criterion (compare with step 125 of FIG. 1), and—responsive to determining that the number of sub-ADCs in the set does not fulfill the set size criterion—provide parameter control signaling 207 (compare with step 130 of FIG. 1).

The parameter control signaling 207 is configured to adapt one or more operational parameter of the plurality of sub-ADCs, and may, for example, be provided to some or each of the sub-ADCs 210*a*, 210*b*, 210*c*, . . . , 210*n* and/or may be provided to other mechanisms of the controlling circuitry 250, as suitable. Alternatively or additionally, the parameter control signaling may be provided to another unit, such as a voltage source (VS) 240, a current source (CS) 240, or a clock circuit (CLK) 240.

As mentioned above, the control circuitry may also be configured with similar mechanisms to adapt the operational parameter(s) when another set size criterion is fulfilled, to decrease the (e.g., minimum and/or average) set size.

Of course, the signaling path 207 may comprise several different signaling paths (e.g., respective ones for selection/causing, forced termination, and parameter control), even if illustrated as a single signaling path in FIG. 2.

The output buffer 220 is operatively connected to each of the sub-ADCs of the plurality as illustrated by 203, for reception of an output sample of the sub-ADC. Buffer control signaling 208 may be provided by the controlling circuitry 250 to the output buffer 220 (compare with step 150 of FIG. 1) to manage the output buffer operation. Thus, the output buffer 220 may also be operatively connected to the controlling circuitry 250 for reception of the buffer control signaling 208.

The buffer control signaling 208 may be indicative of a position of the output buffer, and the output buffer may be configured to insert the received output sample into the indicated position of the output buffer.

As mentioned above, the output buffer is typically able to read one or more (or none) digitized sample in a single read cycle. This can be formulated as the output buffer being configured to simultaneously receive output samples from a collection of the sub-ADCs, wherein the collection has a varying cardinality in an interval from zero to a maximum cardinality, and wherein the maximum cardinality is larger than one. Of course, the maximum cardinality is not larger than the number of sub-ADCs in the plurality; but may be lower than or equal thereto.

It should be noted that details and variations described in connection with one of the FIGS. 1 and 2 may be equally applicable in relation to the other one of the FIGS. 1 and 2.

Figure 3:
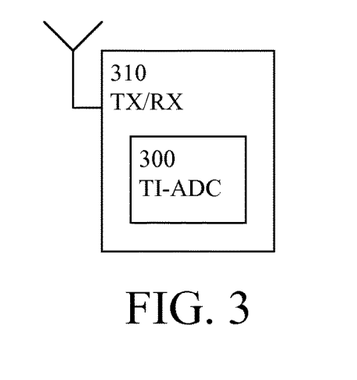
FIG. 3 is a schematic block diagram illustrating an example wireless transceiver according to some embodiments.

FIG. 3 schematically illustrates an example wireless transceiver (TR/RX) 310 comprising a TI-ADC 300 (e.g., the example TI-ADC 200 of FIG. 2) according to some embodiments. The example transceiver 310 may be comprised in a wireless communication node, such as a network node or a wireless communication device (e.g., a user terminal), according to some embodiments.

Figure 4:
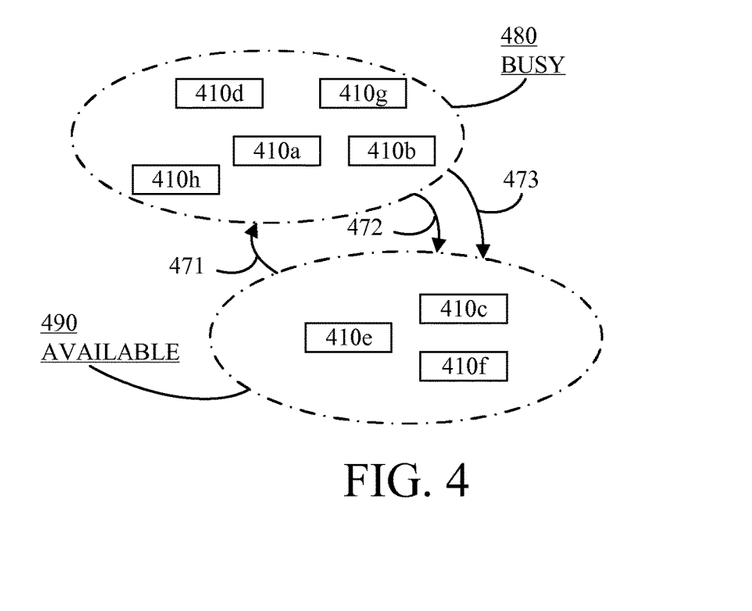
FIG. 4 is a schematic drawing illustrating example set maintenance according to some embodiments.

FIG. 4 schematically illustrates example set maintenance according to some embodiments. The figure shows a snapshot of the corresponding states of a plurality (eight in this example) of sub-ADCs 410*a*, . . . , 410*h* of a TI-ADC (e.g., the TI-ADC 200 of FIG. 2). The grouping of the sub-ADCs shown in FIG. 4 represents a first grouping 480 of sub-ADCs

410a, 410b, 410d, 410g, 410h that are currently busy and a second grouping 490 of sub-ADCs 410c, 410e, 410f that are currently available (not busy). Thus, the grouping 490 represents the set/pool of sub-ADCs currently available for processing of an input sample, as referred to above.

When a sub-ADC of the maintained set 490 is selected for processing of a new input sample (compare with step 116 of FIG. 1), the selected sub-ADC is removed from the set 490 (compare with step 117 of FIG. 1) as illustrated at 471. As the selected sub-ADC is caused to process the new input sample (compare with step 118 of FIG. 1) it then belongs to the grouping 480 of busy sub-ADCs.

When a sub-ADC of the grouping 480 provides an availability signal (compare with step 112 of FIG. 1), that sub-ADC is added to the maintained set 490 (compare with step 113 of FIG. 1) as illustrated at 472 (and removed from the grouping 480 of busy sub-ADCs).

Similarly, when a sub-ADC of the grouping 480 is forced to terminate the processing of the current sample (compare with step 144 of FIG. 1), that sub-ADC is added to the maintained set 490 (compare with step 113 of FIG. 1) as illustrated at 473 (and removed from the grouping 480 of busy sub-ADCs).

Since the sub-ADCs take different amount of time to finish their processing, an output buffer may be applied to sort the outputs into a data stream, ordered in accordance with the times at which the corresponding input samples were taken.

Therefore, the output buffer (e.g., 220 of FIG. 2) is operatively connected to each of the sub-ADCs of the plurality for reception of an output sample of the sub-ADC, and may be operatively connected to the controlling circuitry for reception of buffer control signaling indicative of a position of the output buffer, wherein the output buffer is configured to insert the received output sample into the position of the output buffer.

The position may be determined by the controlling circuitry in any suitable way. For example, the controlling circuitry may temporarily store an indication of the processing start time for each busy sub-ADC and indicate the position accordingly for each sub-ADC that terminates its processing of a sample. Alternatively, the controlling circuitry may temporarily store the position of the output buffer (where the output sample is to be inserted) for each busy sub-ADC. Yet alternatively, the controlling circuitry may, for each sub-ADC where processing of a sample is initiated, start a counter at the time of initiation. When a sub-ADC terminates its processing of a sample, the position (associated with the starting time of the processing) may be determined by removing a time corresponding to the counter value from a current time.

The output buffer should preferably be able to receive output samples from multiple sub-ADCs (i.e., for multiple positions of the buffer) simultaneously, since multiple sub-ADCs may terminate their processing in the same clock cycle.

As mentioned above, buffer length poses requirements on the maximum processing time for a sample, or vice versa. Generally, the length of the output buffer may be equal to the maximum processing time for a sample to not risk sample loss. In some embodiments, the length of the buffer may be slightly less than the maximum processing time for a sample, accepting a non-zero probability of sample loss. If the processing time for a sample also has a minimum value, however, the buffer length can be reduced without risk for sample loss. The length of the buffer may then be set to the maximum processing time for a sample minus the minimum processing time for a sample (possibly plus two positions, or more, as explained below).

Figure 5:
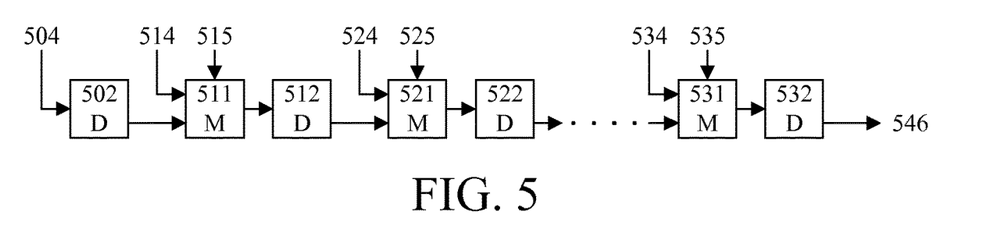
FIGS. 5 and 6 are schematic block diagrams illustrating example buffers according to some embodiments.
Figure 6:
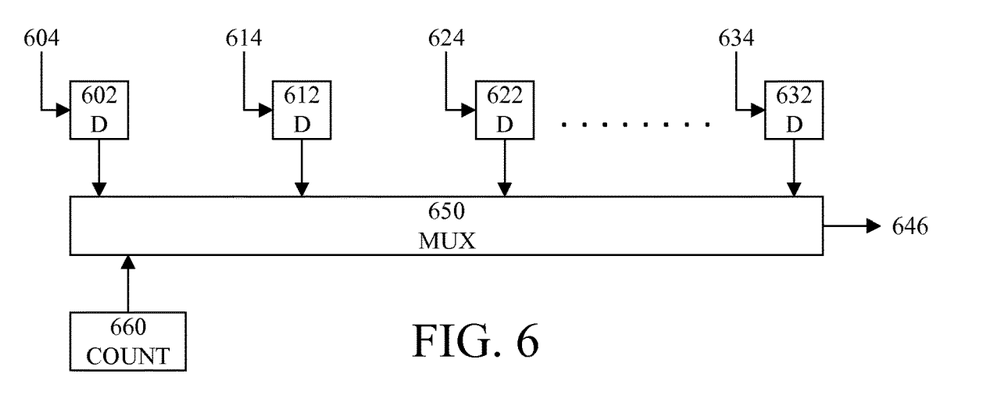

Two example of buffer types suitable for use as output buffer include buffers based on shift registers (exemplified in FIG. 5) and buffers based on cyclically read memories (exemplified in FIG. 6).

The shift register buffer of FIG. 5 comprises 2:1 multiplexing elements (M) 511, 521, 531 and delay elements (D) 502, 512, 522, 532. Each multiplexing element has a first input from the previous delay element and a second input 514, 524, 534 operable to receive a newly read digitized sample value from the output of a sub-ADC. Each multiplexing element also has a control signal input 515, 525, 535 that implements a selection between the first input and the second input for the corresponding memory element. Thereby, the shift register can be written to in all its different stages. Each delay element has an associated multiplexing element, except the first delay element 502 where the newly read digitized sample is input directly at 504, when applicable. The sorted data stream is output at the read-out point 546.

To keep track of where along the shift register to insert the data, a counter can be used for each sub-ADC to count the number of clock cycles the conversion of that sub-ADC takes, which counter value may then be used to decide the position where the data should be inserted.

As mentioned before, the shift register will sometimes receive multiple writes simultaneously (to be inserted at different positions), sometimes receive a single write, and sometimes receive no writes. Typically, the average number of writes per clock cycle is one.

A variant of the implementation illustrated in FIG. 5 is that the shift register may be realized by rotating the read-out point and the second inputs, rather than shifting the data itself. Then, the buffer should be cyclically arranged.

A cyclically read memory buffer will typically have less read and write operations that the shift register buffer; potentially saving power. The cyclically read memory buffer of FIG. 6 comprises delay (or memory) elements (D) 602, 612, 622, 632 with respective inputs 604, 614, 624, 634 operable to receive a newly read digitized sample value from the output of a sub-ADC.

A multiplexer (MUX) 650 reads one delay element at a time and outputs the corresponding digitized samples in sorted data stream at 646. A counter function (COUNT) 660—not to be confused with the earlier-described counter for keeping track of how long time the conversion takes for a sub-ADC—determines which delay element is to be read at each point in time.

In this type of output buffer, the write position (position) for a newly read digitized sample value from the output of a sub-ADC will depend on both the conversion time (sub-ADCdelay) of the sub-ADC and of the state (counterstate) of the counter function 660:

$$\text{position} = (1 + \text{counterstate} + \text{maxdelay} - \text{subADCdelay}) \bmod K,$$

where counterstate is the current value of the counter function 660 (corresponding to the delay element currently being read), maxdelay is the maximum processing duration, and K is the length of the buffer.

If a minimum processing duration mindelay is known, the buffer length may be set to K=maxdelay−(mindelay−2), where the extra two elements are to ensure that read and write never occurs in the same position. The expression above can still be used to determine the write position.

Generally, the counter function 660 may be incremental mod K (as in the above examples) or decremental mod K, both of which results in cyclic read-out. Even more generally, the counter function may be generalized to a function that determines the read order according to any suitable sequence. In both the latter cases, the determination of the write position need to be adjusted accordingly.

Figure 7:
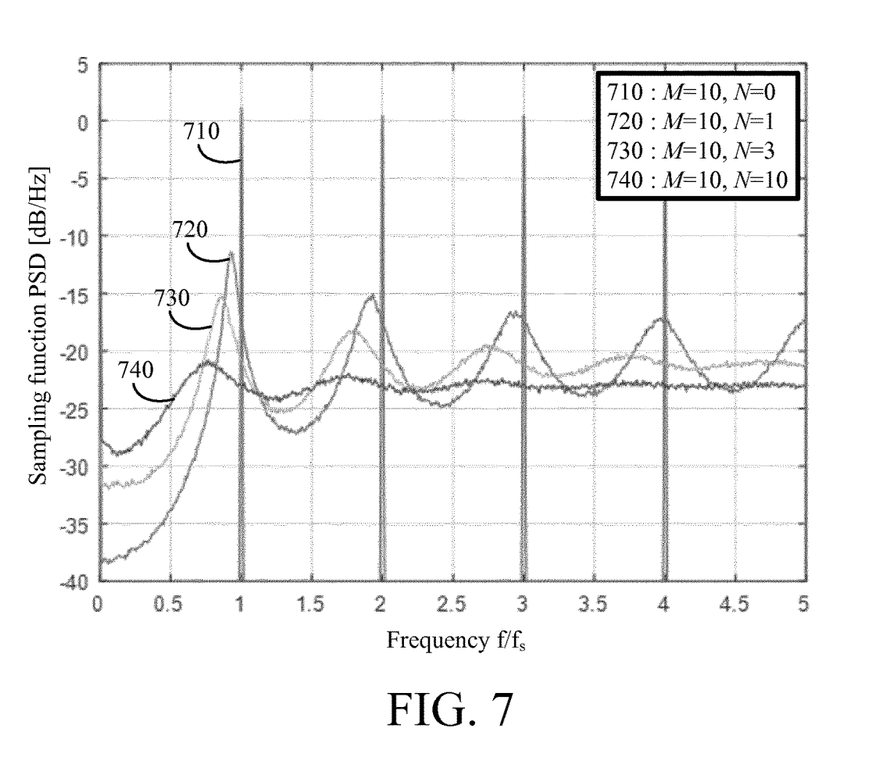
FIG. 7 is a plot illustrating a frequency domain sampling function according to some embodiments.

FIG. 7 is a plot illustrating an example frequency domain sampling function for one sub-ADC in a TI-ADC in the form of power spectral density (PSD). It may be seen that when there are M+N=10 sub-ADCs which are all busy (N=0) as illustrated by 710, distinct frequency tones appear in the PSD. Keeping the number of busy sub-ADCs constant (M=10) while increasing the overall number of sub-ADCs, thereby increasing the set size (N=1, 3, 10) for the pool of available sub-ADCs as illustrated by 720, 730, 740, the frequency tones get less distinct while the overall noise floor increases. Thus, whitening is achieved. Information such as that of FIG. 7 (per sub-ADC and/or averaged over the plurality of sub-ADCs) may be used to determine the set size criterion elaborated on above.

Figure 8:
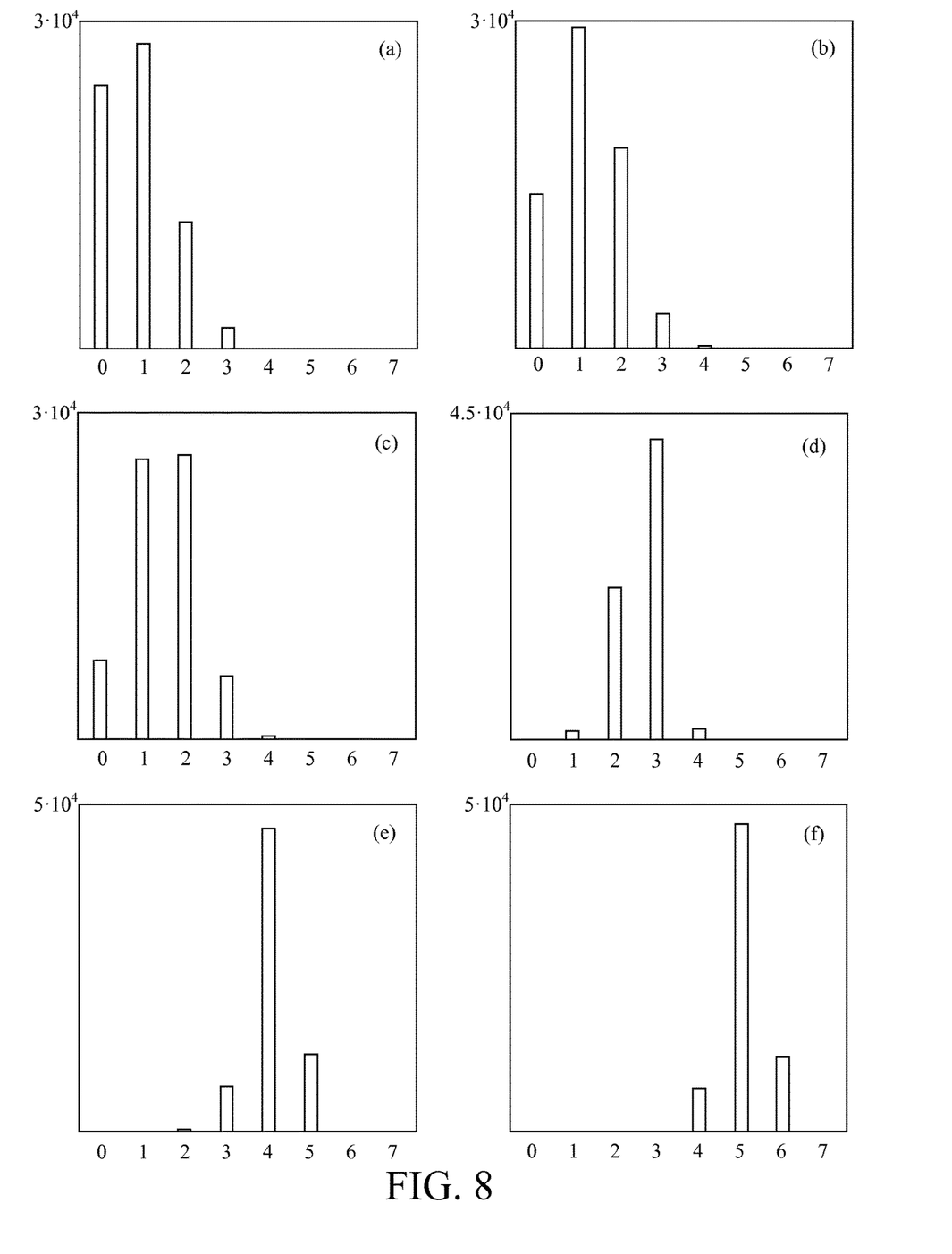
FIG. 8 is a collection of plots illustrating example set size distributions according to some embodiments.
Figure 9:
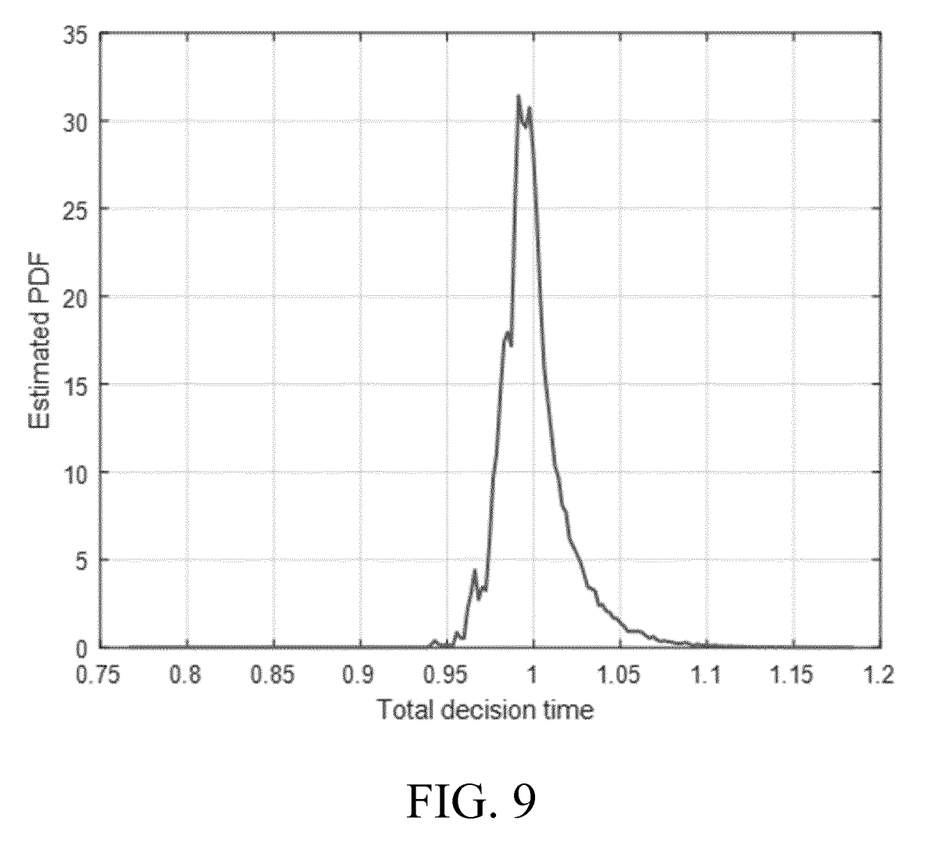
FIG. 9 is a plot illustrating an example distribution of a normalized conversion time according to some embodiments.

FIG. 8 is a collection of plots illustrating example set size distributions according to some embodiments. In this example, the plurality contains 32 sub-ADCs with an aggregated sampling frequency of 32 (i.e., the sample rate of the entire TI-ADC). The average conversion time of each sub-ADC is h. Plot (a) corresponds to h=1, plot (b) corresponds to h=0.80, plot (c) corresponds to h=0.70, plot (d) corresponds to h=0.60, plot (e) corresponds to h=0.57, and plot (f) corresponds to h=0.55. The simulation of FIG. 8 assumes a distribution of a normalized conversion time for each constituent ADC as shown in FIG. 9. The results indicate that the average rate at which samples arrive at each sub-ADC might be set to h≤0.6 times the rate corresponding to an average set size of zero (h=1) to guarantee that the probability of the pool size being zero is negligible. Correspondingly, there might be a requirement on a certain average/minimum pool size to obtain the desired effect of randomization. A further aspect that may be considered in this context is that, to avoid wasting processing capacity by having unnecessarily many available sub-ADCs, the value of h may preferably be kept at a reasonably high value.

By application of embodiments disclosed herein, sub-ADCs with different (e.g., signal dependent) conversion time can be used to their full potential in time-interleaved ADCs. As exemplified extensively herein, an adaptive resource management function may be used to adapt operation of the sub-ADCs, so that performance of the time-interleaved ADC can be maintained at low power consumption.

The described embodiments and their equivalents may be realized in software or hardware or a combination thereof. The embodiments may be performed by general purpose circuitry.

Examples of general purpose circuitry include digital signal processors (DSP), central processing units (CPU), co-processor units, field programmable gate arrays (FPGA) and other programmable hardware. Alternatively or additionally, the embodiments may be performed by specialized circuitry, such as application specific integrated circuits (ASIC). The general purpose circuitry and/or the specialized circuitry may, for example, be associated with or comprised in an apparatus such as a wireless receiver, a wireless communication device, or a network node.

Embodiments may appear within an electronic apparatus (such as a wireless receiver, a wireless communication device, or a network node) comprising arrangements, circuitry, and/or logic according to any of the embodiments described herein. Alternatively or additionally, an electronic apparatus (such as a wireless receiver, a wireless communication device, or a network node) may be configured to perform methods according to any of the embodiments described herein.

Figure 10:
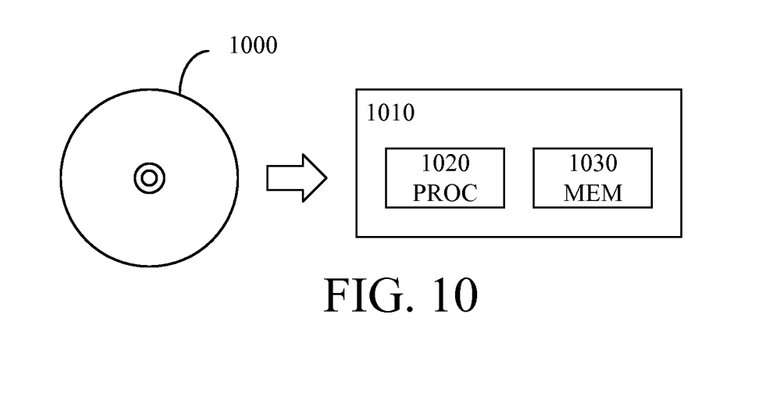
FIG. 10 is a schematic drawing illustrating an example computer readable medium according to some embodiments.

According to some embodiments, a computer program product comprises a computer readable medium such as, for example a universal serial bus (USB) memory, a plug-in card, an embedded drive or a read only memory (ROM). FIG. 10 illustrates an example computer readable medium in the form of a compact disc (CD) ROM 1000. The computer readable medium has stored thereon a computer program comprising program instructions. The computer program is loadable into a data processor (PROC) 1020, which may, for example, be comprised in a wireless receiver, a wireless communication device, or a network node 1010. When loaded into the data processing unit, the computer program may be stored in a memory (MEM) 1030 associated with or comprised in the data-processing unit. According to some embodiments, the computer program may, when loaded into and run by the data processing unit, cause execution of method steps according to, for example, any of the methods illustrated in FIG. 1 or otherwise described herein.

Generally, all terms used herein are to be interpreted according to their ordinary meaning in the relevant technical field, unless a different meaning is clearly given and/or is implied from the context in which it is used.

Reference has been made herein to various embodiments. However, a person skilled in the art would recognize numerous variations to the described embodiments that would still fall within the scope of the claims.

For example, the method embodiments described herein discloses example methods through steps being performed in a certain order. However, it is recognized that these sequences of events may take place in another order without departing from the scope of the claims. Furthermore, some method steps may be performed in parallel even though they have been described as being performed in sequence. Thus, the steps of any methods disclosed herein do not have to be performed in the exact order disclosed, unless a step is explicitly described as following or preceding another step and/or where it is implicit that a step must follow or precede another step.

In the same manner, it should be noted that in the description of embodiments, the partition of functional blocks into particular units is by no means intended as limiting. Contrarily, these partitions are merely examples. Functional blocks described herein as one unit may be split into two or more units. Furthermore, functional blocks described herein as being implemented as two or more units may be merged into fewer (e.g. a single) unit.

Any feature of any of the embodiments disclosed herein may be applied to any other embodiment, wherever suitable. Likewise, any advantage of any of the embodiments may apply to any other embodiments, and vice versa.

Hence, it should be understood that the details of the described embodiments are merely examples brought forward for illustrative purposes, and that all variations that fall within the scope of the claims are intended to be embraced therein.

The invention claimed is:

1. Controlling circuitry operably connectable to a plurality of constituent analog-to-digital converters (sub-ADCs) of an asynchronous time-interleaved analog-to-digital converter (TI-ADC) the controlling circuitry being configured to maintain a set of a number of sub-ADCs currently available for processing of an input sample, wherein the set is a subset of the plurality, by:
- reception, from each of one or more of the sub-ADCs of the plurality, of an availability signal indicative of availability of the corresponding sub-ADC;
- responsive to the reception of the availability signal, addition of the corresponding sub-ADC to the set;
- for each new input sample of a plurality of new input samples, selection of a sub-ADC of the set for processing of the new input sample; and
- responsive to the selection, removal of the selected sub-ADC from the set and causing of the selected sub-ADC to process the new input sample,
- wherein the number of sub-ADCs that are currently available for processing the new input samples dynamically varies over time between a minimum number of sub-ADCs up to two or more sub-ADCs that are currently available for processing.

2. The controlling circuitry of claim 1, wherein the selection comprises randomized selection.

3. The controlling circuitry of claim 1, wherein the controlling circuitry is further configured to monitor one or more statistical properties of the number of sub-ADCs in the set.

4. The controlling circuitry of claim 1, wherein the controlling circuitry is further configured to:
- determine whether the number of sub-ADCs in the set fulfills a set size criterion; and
- responsive to determination that the number does not fulfill the set size criterion, provide parameter control signaling configured to adapt one or more operational parameter of the plurality of sub-ADCs.

5. The controlling circuitry of claim 4, wherein the set size criterion comprises one or more of:
- a minimum number of sub-ADCs in the set being larger than a minimum number threshold; and
- an average number of sub-ADCs in the set being larger than an average number threshold.

6. The controlling circuitry of claim 4, wherein the operational parameter is one or more of: a supply voltage, a bias current, and a sampling frequency.

7. The controlling circuitry of claim 1, wherein the controlling circuitry is further configured to force termination of processing of a particular input sample by a particular sub-ADC when a duration of the processing has reached a maximum processing duration.

8. A time-interleaved analog-to-digital converter, TI-ADC, comprising the controlling circuitry according to claim 1, and a plurality of sub-ADCs, wherein each sub-ADC is configured to process an input sample responsive to selection by the controlling circuitry and provide an availability signal indicative of availability to the controlling circuitry in association with completing the processing.

9. The time-interleaved analog-to-digital converter (TI-ADC) of claim 8, further comprising an output buffer operatively connected to each of the sub-ADCs of the plurality for reception of an output sample of the sub-ADC, and operatively connected to the controlling circuitry for reception of buffer control signaling indicative of a position of the output buffer, the output buffer configured to insert the received output sample into the position of the output buffer.

10. The time-interleaved analog-to-digital converter (TI-ADC) of claim 9, wherein the output buffer is configured to simultaneously receive output samples from a collection of the sub-ADCs, the collection having a varying cardinality in an interval from zero to a maximum cardinality, wherein the maximum cardinality is larger than one.

11. A wireless communication receiver comprising the time-interleaved analog-to-digital converter (TI-ADC) of claim 8.

12. A wireless communication node comprising the time-interleaved analog-to-digital converter (TI-ADC) of claim 8.

13. A method of controlling a plurality of constituent analog-to-digital converters (sub-ADCs) of an asynchronous time-interleaved analog-to-digital converter (TI-ADC) the method comprising maintaining a set of a number of sub-ADCs currently available for processing of an input sample, wherein the set is a subset of the plurality, by:
- receiving, from each of one or more of the sub-ADCs of the plurality, an availability signal indicative of availability of the corresponding sub-ADC;
- responsive to the reception of the availability signal, adding the corresponding sub-ADC to the set;
- for each new input sample of a plurality of new input samples, selecting a sub-ADC of the set for processing of the new input sample; and
- responsive to the selection, removing the selected sub-ADC from the set and causing the selected sub-ADC to process the new input sample,
- wherein the number of sub-ADCs that are currently available for processing the new input samples dynamically varies over time between a minimum number of sub-ADCs up to two or more sub-ADCs that are currently available for processing.

14. The method of claim 13, wherein selecting comprises randomly selecting a sub-ADC of the set.

15. The method of claim 13, further comprising monitoring one or more statistical properties of the number of sub-ADCs in the set.

16. The method of claim 13, further comprising:
- determining whether the number of sub-ADCs in the set fulfills a set size criterion; and
- responsive to determination that the number does not fulfill the set size criterion, providing parameter control signaling configured to adapt one or more operational parameter of the plurality of sub-ADCs.

17. The method of claim 16, wherein the set size criterion comprises one or more of:
- a minimum number of sub-ADCs in the set being larger than a minimum number threshold; and
- an average number of sub-ADCs in the set being larger than an average number threshold.

18. The method of claim 16, wherein the operational parameter is one or more of: a supply voltage, a bias current, and a sampling frequency.

19. The method of claim 13, further comprising forcing termination of processing of a particular input sample by a particular sub-ADC when a duration of the processing has reached a maximum processing duration.

20. The method of claim 13, wherein the TI-ADC further comprises an output buffer operatively connected to each of the sub-ADCs of the plurality for reception of an output sample of the sub-ADC, the method further comprising providing buffer control signaling indicative, for each output sample, of a position of the output buffer, thereby causing insertion of the output sample into the position of the output buffer.

21. A non-transitory computer readable medium, having thereon a computer program comprising program instructions, the computer program being loadable into a data processing unit and configured to cause execution of a method when the computer program is run by the data processing unit, wherein the method is for controlling a plurality of constituent analog-to-digital converters (sub- ADCs) of an asynchronous time-interleaved analog-to-digital converter (TI-ADC) the method comprising maintaining a set of a number of sub-ADCs currently available for processing of an input sample, wherein the set is a subset of the plurality, by:

receiving, from each of one or more of the sub-ADCs of the plurality, an availability signal indicative of availability of the corresponding sub-ADC;

responsive to the reception of the availability signal, adding the corresponding sub-ADC to the set;

for each new input sample of a plurality of new input samples, selecting a sub-ADC of the set for processing of the new input sample; and responsive to the selection, removing the selected sub-ADC from the set and causing the selected sub-ADC to process the new input sample, wherein the number of sub-ADCs that are currently available for processing the new input samples dynamically varies over time between a minimum number of sub-ADCs up to two or more sub-ADCs that are currently available for processing.

* * * * *